US012652986B2

(12) United States Patent
Kim et al.

(10) Patent No.: US 12,652,986 B2
(45) Date of Patent: Jun. 9, 2026

(54) SUBSTRATE PROCESSING APPARATUS AND SUBSTRATE PROCESSING METHOD

(71) Applicant: SEMES CO., LTD., Cheonan-si (KR)

(72) Inventors: Kibong Kim, Paju-si (KR); Seunghoon Oh, Cheonan-si (KR); Younghun Lee, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 142 days.

(21) Appl. No.: 18/395,173

(22) Filed: Dec. 22, 2023

(65) Prior Publication Data

US 2024/0213049 A1    Jun. 27, 2024

(30) Foreign Application Priority Data

Dec. 27, 2022    (KR) ........................ 10-2022-0185899

(51) Int. Cl.
*H01L 21/67* (2006.01)
*H10P 72/00* (2026.01)

(52) U.S. Cl.
CPC ...... *H10P 72/0414* (2026.01); *H10P 72/0408* (2026.01); *H10P 72/0431* (2026.01); *H10P 72/0462* (2026.01); *H10P 72/0604* (2026.01); *H10P 72/0402* (2026.01); *H10P 72/0602* (2026.01)

(58) Field of Classification Search
CPC ......... H01L 21/67248; H01L 21/67098; H01L 21/67034; H01L 21/6719; H01L 21/67253; H01L 21/67017; H01L 21/67051; H10P 72/0414; H10P 72/0604; H10P 72/0402; H10P 72/0408; H10P 72/0431; H10P 72/0462; H10P 72/0602
See application file for complete search history.

(56) References Cited

U.S. PATENT DOCUMENTS

| | | | |
|---|---|---|---|
| 10,619,922 B2 | 4/2020 | Goshi et al. | |
| 2007/0134602 A1 * | 6/2007 | Matsumoto | ............. C23C 18/02 430/348 |
| 2017/0008040 A1 * | 1/2017 | Jeong | ................ H01L 21/67017 |
| 2020/0098594 A1 * | 3/2020 | Kiyohara | .......... H01L 21/67034 |

(Continued)

FOREIGN PATENT DOCUMENTS

| | | | | | |
|---|---|---|---|---|---|
| JP | 2023038790 A | * | 3/2023 | ....... | H01L 21/68764 |
| JP | 2023158709 A | * | 10/2023 | | |

(Continued)

*Primary Examiner* — Benjamin L Osterhout

(57) ABSTRACT

Provided is a substrate processing apparatus including a chamber including an inner space, a fluid supply unit configured to supply a supercritical fluid to the inner space, a fluid exhaust unit configured to exhaust the supercritical fluid from the inner space, and a controller configured to control the fluid supply unit and the fluid exhaust unit, wherein the fluid supply unit includes a fluid supply source, a supply line connecting the fluid supply source and the chamber to each other, a flow rate control valve installed in the supply line, and a flow rate measuring member installed in the supply line and positioned between the fluid supply source and the flow rate control valve, and the controller is further configured to control the flow rate control valve to supply the supercritical fluid, based on a flow rate of the supercritical fluid measured by the flow rate measuring member.

19 Claims, 4 Drawing Sheets

(56)        References Cited

U.S. PATENT DOCUMENTS

| | | | |
|---|---|---|---|
| 2021/0082691 A1 * | 3/2021 | Fukui | ............... H01L 21/02043 |
| 2022/0406624 A1 | 12/2022 | Cha et al. | |

FOREIGN PATENT DOCUMENTS

| | | | | |
|---|---|---|---|---|
| KR | 10-2017-0103653 | 9/2017 | | |
| KR | 10-2019-0001753 | 1/2019 | | |
| KR | 10-2020-0035357 | 4/2020 | | |
| KR | 10-2217412 | 2/2021 | | |
| KR | 102355357 B1 * | 2/2022 | ....... | H01L 21/67126 |
| KR | 20220092790 A * | 7/2022 | ....... | H01L 21/67034 |
| KR | 10-2022-0167428 | 12/2022 | | |

* cited by examiner

SUBSTRATE PROCESSING APPARATUS AND SUBSTRATE PROCESSING METHOD

CROSS-REFERENCE TO RELATED APPLICATION

This application is based on and claims priority under 35 U.S.C. § 119 to Korean Patent Application No. 10-2022-0185899, filed on Dec. 27, 2022, in the Korean Intellectual Property Office, the disclosure of which is incorporated by reference herein in its entirety.

BACKGROUND

1. Field

The disclosure relates to a substrate processing apparatus and a substrate processing method.

2. Description of the Related Art

In order to manufacture a semiconductor device, various processes, such as photolithography, etching, ashing, ion implantation, and thin-film deposition, are performed to form a desired pattern on a substrate such as a wafer. Various treatment liquids and treatment gases are used in each process, and particles and process by-products are formed during the processes. A cleaning process is performed before and after each process to remove such particles and process by-products from the substrate.

In the art, a cleaning process liquid-treats the substrate with chemicals and a rinsing liquid. In addition, a drying process is performed to remove the chemicals and the rinsing liquid remaining on the substrate. Examples of drying processes may include a rotary drying process in which the substrate is rotated at high speed to remove the rinsing liquid remaining on the substrate. However, in such a rotary drying method, there is a concern that the pattern formed on the substrate may collapse.

Recently, a supercritical drying process is used for supplying an organic solvent such as isopropyl alcohol (IPA) onto a substrate to replace a rinsing liquid remaining on the substrate with the organic solvent having a low surface tension, and then supplying a drying gas (e.g., carbon dioxide) in a supercritical state onto the substrate to remove the organic solvent remaining on the substrate.

SUMMARY

Provided is a substrate processing apparatus for correcting a flow rate error of a flow meter by maintaining a single phase when supplying a supercritical fluid.

Provided is a substrate processing method for correcting a flow rate error of a flow meter by maintaining a single phase when supplying a supercritical fluid.

Additional aspects will be set forth in part in the description which follows and, in part, will be apparent from the description, or may be learned by practice of the presented embodiments of the disclosure.

According to an aspect of the disclosure, a substrate processing apparatus includes a chamber including an inner space, a fluid supply unit configured to supply a supercritical fluid to the inner space, a fluid exhaust unit configured to exhaust the supercritical fluid from the inner space, and a controller configured to control the fluid supply unit and the fluid exhaust unit, wherein the fluid supply unit includes a fluid supply source, a supply line connecting the fluid supply source and the chamber to each other, a flow rate control valve installed in the supply line, and a flow rate measuring member installed in the supply line and positioned between the fluid supply source and the flow rate control valve, and the controller is further configured to control the flow rate control valve to supply the supercritical fluid based on a flow rate of the supercritical fluid measured by the flow rate measuring member.

According to another aspect of the disclosure, a method of treating a substrate with a supercritical fluid in a supercritical state by using a substrate processing apparatus including a chamber, a fluid supply source, and a flow rate control valve includes loading the substrate into an inner space of the chamber, a pressurization operation of increasing a pressure of the inner space by supplying the supercritical fluid to the inner space through a supply line communicating with the inner space, a flow operation of flowing the supercritical fluid by supplying the supercritical fluid to the inner space or discharging the supercritical fluid from the inner space, and a depressurization operation of decreasing the pressure of the inner space by discharging the supercritical fluid from the inner space through a depressurization line communicating with the inner space, wherein the pressurization operation and the flow operation include measuring a flow rate of the supercritical fluid by using a flow rate measuring member installed in the supply line and positioned between the fluid supply source and the flow rate control valve, and the flow rate control valve is controlled to supply the supercritical fluid based on the flow rate of the supercritical fluid measured in the measuring of the flow rate of the supercritical fluid.

According to another aspect of the disclosure, a substrate processing apparatus for drying a substrate by using a supercritical fluid includes a chamber including an inner space, a fluid supply unit configured to supply the supercritical fluid to the inner space, a fluid exhaust unit configured to exhaust the supercritical fluid from the inner space, and a controller configured to control the fluid supply unit and the fluid exhaust unit, the fluid supply unit includes a fluid supply source storing the supercritical fluid, a supply line connecting the fluid supply source and the chamber to each other, a flow rate control valve installed in the supply line, and a flow rate measuring member installed in the supply line and positioned between the fluid supply source and the flow rate control valve, and the controller is further configured to control at least one of a temperature and a pressure of the supercritical fluid, and to control the flow rate control valve to supply the supercritical fluid based on a flow rate of the supercritical fluid measured by the flow rate measuring member.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
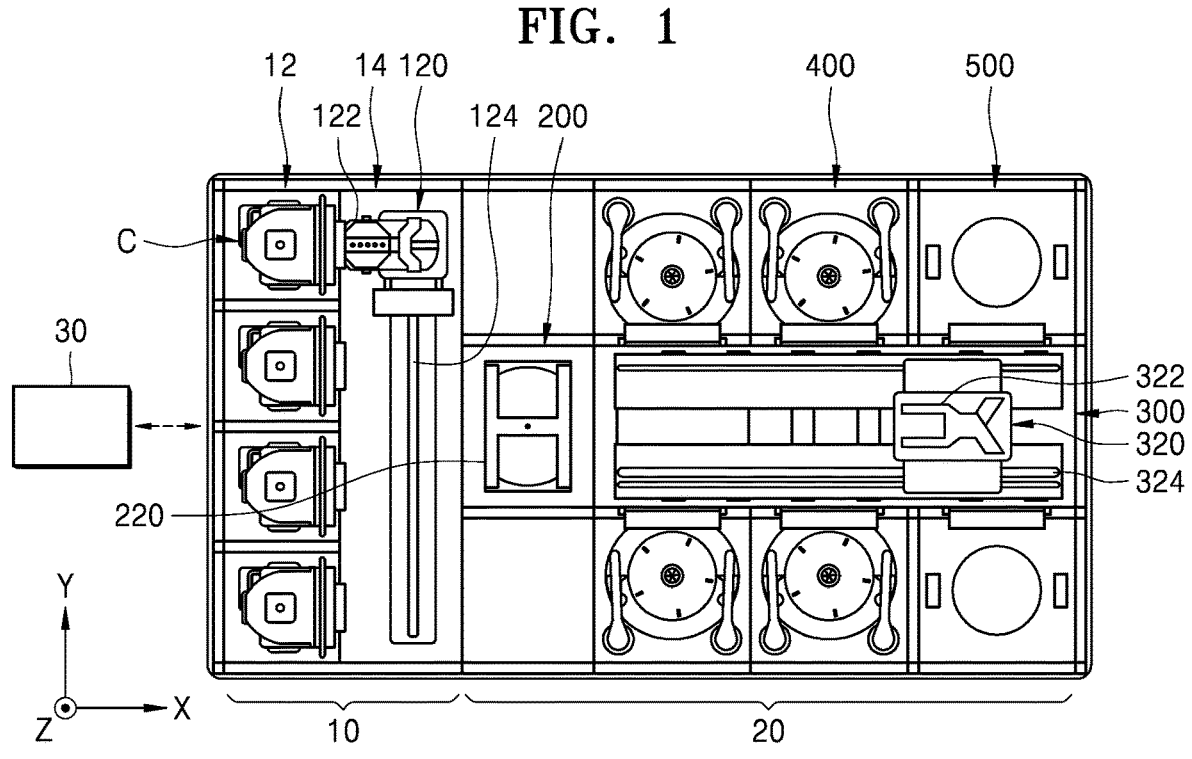
FIG. 1 is a plan view schematically illustrating a substrate processing apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to the accompanying drawings. The same reference numerals are used for the same components in the drawings, and redundant descriptions thereof will be omitted.

FIG. 1 is a plan view schematically illustrating a substrate processing apparatus according to an embodiment.

Referring to FIG. 1, the substrate processing apparatus may include an index module 10, a processing module 20, and a controller 30. The index module 10 and the processing module 20 may be arranged in one direction. Hereinafter, the direction in which the index module 10 and the processing module 20 are arranged is referred to as a first direction X, the direction perpendicular to the first direction X is referred to as a second direction Y, and the direction perpendicular to both the first direction X and the second direction Y is referred to as a third direction Z.

The index module 10 may transfer a substrate W (see FIG. 2) from a container C in which the substrate W is accommodated to the processing module 20, and accommodate, into the container C, the substrate W that has been completely treated in the processing module 20. The index module 10 may be provided such that the lengthwise direction thereof is the second direction Y. The index module 10 may include a load port 12 and an index frame 14. The load port 12 may be positioned on the opposite side to the processing module 20 with respect to the index frame 14. The container C in which the substrates W are accommodated may be placed on the load port 12. A plurality of load ports 12 may be provided, and the plurality of load ports 12 may be arranged in the second direction Y.

As the container C, an airtight container such as a front-opening unified pod (FOUP) may be used. The container C may be placed on the load port 12 by an operator or a transfer unit such as an overhead transfer unit, an overhead conveyor, or an automatic guided vehicle.

An index robot 120 may be provided in the index frame 14. A guide rail 124 provided in the second direction Y may be provided in the index frame 14, and the index robot 120 may move on the guide rail 124. The index robot 120 may include a hand 122 on which the substrate W is placed. The hand 122 may move forward and backward, rotate about the third direction Z, and move in the third direction Z. A plurality of hands 122 may be arranged spaced apart from each other in the vertical direction, and the hands 122 may move forward and backward independently of each other.

The controller 30 may control the substrate processing apparatus. The controller 30 may include a processor controller consisting of a microprocessor (e.g., a computer) for executing control of the substrate processing apparatus, a keyboard for an operator to perform a command input manipulation and the like to manage the substrate processing apparatus, a user interface consisting of a display and the like for visualizing and displaying an operation situation of the substrate processing apparatus, and a storage unit storing control programs and various types of data for the substrate processing apparatus to execute a process under control by a process controller, and programs, that is, processing recipes, for executing a process in each component according to a processing condition. Also, the user interface and the storage unit may be connected to the process controller. The processing recipes may be stored in a storage medium in the storage unit, and the storage medium may be a hard disk, a portable disk such as a compact disc read-only memory (CD-ROM) or a digital video disc (DVD), or a semiconductor memory such as flash memory.

The controller 30 may control the substrate processing apparatus to perform a substrate processing method. For example, the controller 30 may control a fluid supply unit 530 and a fluid exhaust unit 550 of the substrate processing apparatus to perform the substrate processing method.

The processing module 20 may include a buffer unit 200, a transfer chamber 300, a liquid treatment chamber 400, and a drying chamber 500. The buffer unit 200 may provide a space in which the substrate W loaded to the processing module 20 and the substrate W unloaded from the processing module 20 temporarily stay. The liquid treatment chamber 400 may perform a liquid treatment process of liquid-treating the substrate W by supplying a liquid onto the substrate W. The drying chamber 500 may perform a drying process of removing the liquid remaining on the substrate W. The transfer chamber 300 may transfer the substrate W between the buffer unit 200, the liquid treatment chamber 400, and the drying chamber 500.

The transfer chamber 300 may be provided such that the lengthwise direction thereof is the first direction X. The buffer unit 200 may be arranged between the index module 10 and the transfer chamber 300. The liquid treatment chamber 400 and the drying chamber 500 may be arranged in a lateral portion of the transfer chamber 300. The liquid treatment chamber 400 and the transfer chamber 300 may be arranged in the second direction Y. The drying chamber 500 and the transfer chamber 300 may be arranged in the second direction Y. The buffer unit 200 may be positioned at one end of the transfer chamber 300.

The liquid treatment chambers 400 may be arranged on both sides of the transfer chamber 300, the drying chambers 500 may arranged on both sides of the transfer chamber 300, and the liquid treatment chambers 400 may be arranged closer to the buffer unit 200 than the drying chambers 500. At one side of the transfer chamber 300, the liquid treatment chambers 400 may be provided in an arrangement of A×B (where each of A and B is a natural number of 1 or greater) in the first direction X and the third direction Z. In addition, at one side of the transfer chamber 300, C×D (where each of C and D is a natural number of 1 or greater) drying chambers 500 may be provided in the first direction X and the third direction Z, respectively. However, the disclosure is not limited thereto, and only liquid treatment chambers 400 may be provided on one side of the transfer chamber 300, and only drying chambers 500 may be provided on the other side of the transfer chamber 300.

The transfer chamber 300 may include a transfer robot 320, a hand 322 and a guide rail 324. The guide rail 324 may be provided in the transfer chamber 300 such that the lengthwise direction thereof is the first direction X, and the transfer robot 320 may move on the guide rail 324. The transfer robot 320 may include the hand 322 on which the substrate W is placed, and the hand 322 may move forward and backward, rotate about the third direction Z, and move in the third direction Z. A plurality of hands 322 may be arranged spaced apart from each other in the vertical direction, and the hands 322 may move forward and backward independently of each other.

The buffer unit 200 may include a plurality of buffers 220 on which the substrate W is placed. The buffers 220 may be spaced apart from each other in the third direction Z. The front face and the rear face of the buffer unit 200 may be opened. Here, the front face is a face facing the index module 10, and the rear face is a face facing the transfer chamber 300. The index robot 120 may approach the buffer unit 200 through the front face, and the transfer robot 320 may approach the buffer unit 200 through the rear face.

Figure 2:
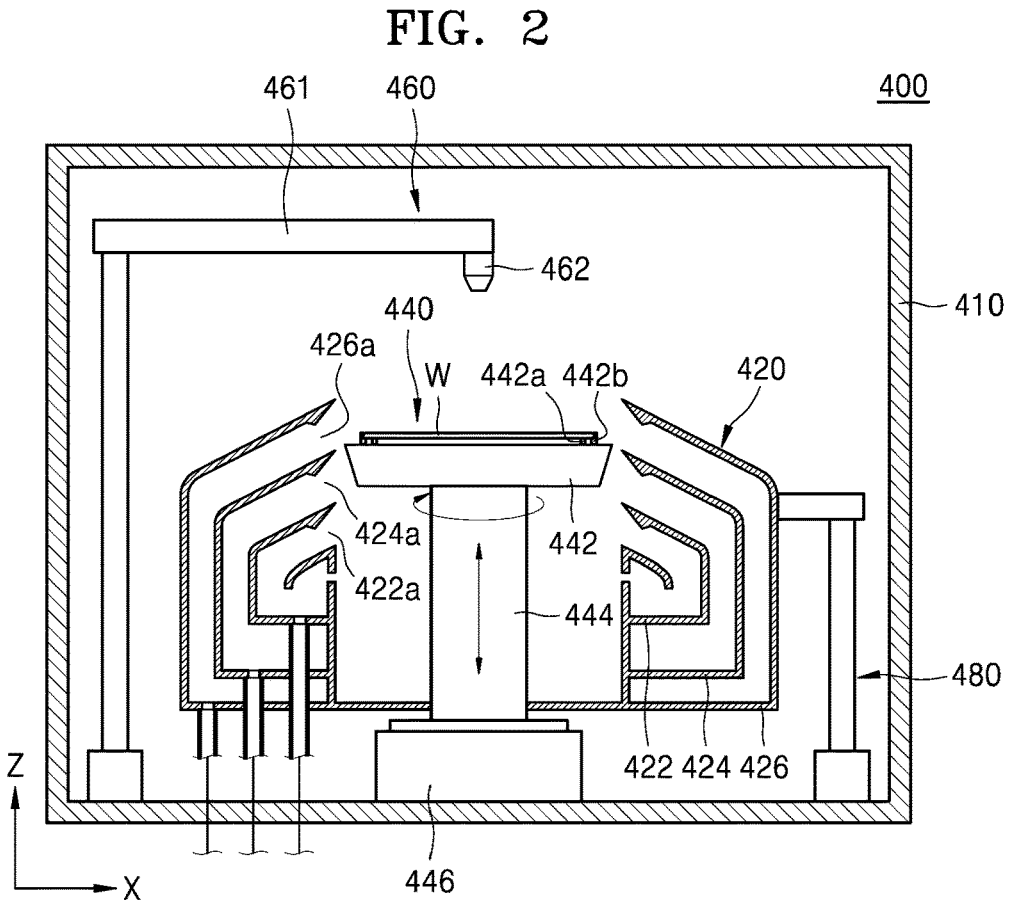
FIG. 2 is a diagram schematically illustrating an embodiment of a liquid treatment chamber of FIG. 1.

FIG. 2 is a diagram schematically illustrating an embodiment of the liquid treatment chamber of FIG. 1.

Referring to FIG. 2, the liquid treatment chamber 400 may include a housing 410, a cup 420, a support unit 440, a liquid supply unit 460 and a lifting unit 480. The housing 410 may have an inner space in which the substrate W is treated. The housing 410 may have a substantially hexahedral shape. In addition, an opening through which the substrate W is loaded or unloaded may be formed in the housing 410.

The cup 420 may have a cylindrical shape with an open top. The cup 420 has a treatment space, and the substrate W may be liquid-treated in the treatment space. The support unit 440 may support the substrate W in the treatment space.

The liquid supply unit 460 may supply a treatment liquid onto the substrate W supported by the support unit 440. A plurality of types of treatment liquids may be provided and sequentially supplied onto the substrate W. The lifting unit 480 may adjust the relative height between the cup 420 and the support unit 440.

The cup 420 may include a plurality of collection containers 422, 424, and 426. Each of the collection containers 422, 424, and 426 may include a collection space for recovering a liquid used in substrate treatment. Each of the collection containers 422, 424, and 426 may have a ring shape surrounding the support unit 440. The treatment liquid scattered by the rotation of the substrate W during the liquid treatment process may flow into the collection space through inlets 422a, 424a, and 426a of the respective collection containers 422, 424, and 426.

The support unit 440 may include a support plate 442 and a drive shaft 444. The upper surface of the support plate 442 may be provided in a substantially circular shape, and may have a diameter greater than that of the substrate W. A support pin 442a may be formed at the center of the support plate 442 to support the rear surface of the substrate W, and the upper end of the support pin 442a may protrude from the support plate 442 such that the substrate W is spaced apart from the support plate 442 by a preset distance. A chuck pin 442b may be positioned at an edge of the support plate 442.

The chuck pin 442b may protrude upward from the support plate 442 and support a lateral portion of the substrate W to prevent the substrate W from being separated from the support unit 440 when the substrate W is rotated. The drive shaft 444 may be driven by the driver 446, and may be connected to the center of the lower surface of the substrate W to rotate the support plate 442.

The liquid supply unit 460 may include a plurality of nozzles 462. The nozzles 462 may supply the treatment liquid to the substrate W. The treatment liquid may be a chemical, a rinsing liquid, or an organic solvent. The chemical may be a chemical with strong acid properties or strong base properties. The rinsing liquid may be pure water. The organic solvent may be isopropyl alcohol (IPA).

The nozzles 462 may supply different types of treatment liquids, respectively. For example, any one of the nozzles 462 may supply a chemical, another of the nozzles 462 may supply a rinsing liquid, and still another one of the nozzles 462 may supply an organic solvent. Here, the rinsing liquid supplied onto the substrate W may be replaced with an organic solvent having a low surface tension.

The lifting unit 480 may move the cup 420 in the vertical direction. The relative height between the cup 420 and the substrate W may be changed by the vertical movement of the cup 420. Accordingly, the collection containers 422, 424, and 426 for recovering treatment liquids are changed according to the types of liquids supplied onto the substrate W, and thus, the liquids may be separated and collected. However, the disclosure is not limited thereto, and the cup 420 may be fixedly installed, and the lifting unit 480 may move the support unit 440 in the vertical direction.

Figure 3:
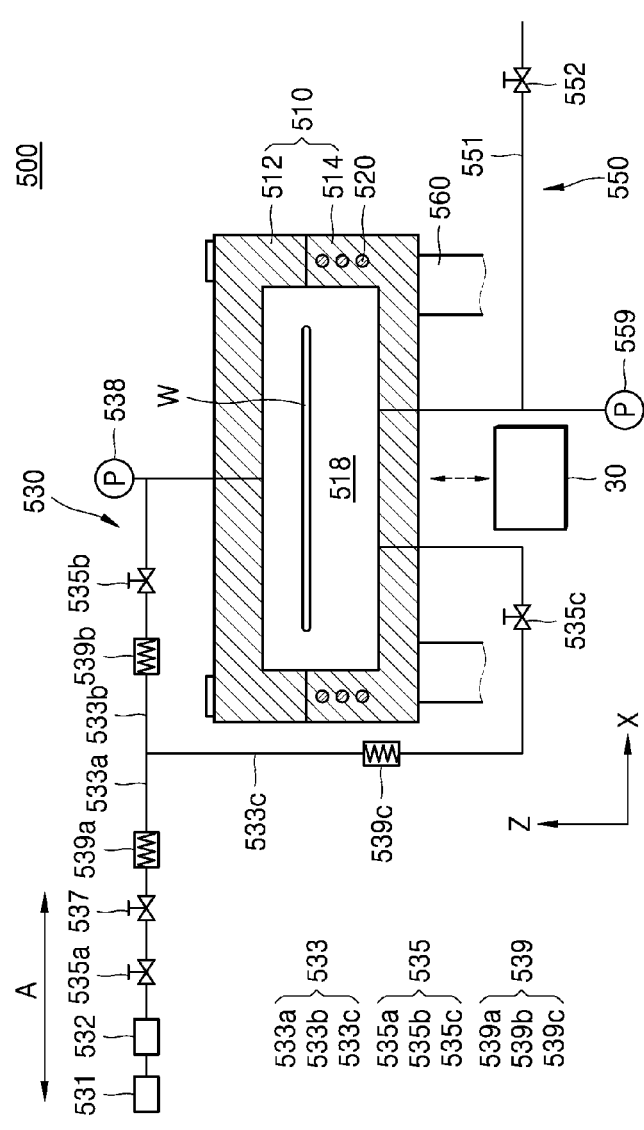
FIG. 3 is a diagram schematically illustrating an embodiment of a drying chamber of FIG. 1.

FIG. 3 is a diagram schematically illustrating an embodiment of the drying chamber of FIG. 1.

Referring to FIG. 3, the drying chamber 500 according to an embodiment may remove a treatment liquid remaining on the substrate W, by using a drying fluid (hereinafter, referred to as a treatment fluid) in a supercritical state. For example, the drying chamber 500 may perform a drying process of removing an organic solvent remaining on the substrate W by using carbon dioxide ($CO_2$) in a supercritical state.

The drying chamber 500 may include a body 510, a temperature control member 520, the fluid supply unit 530, the fluid exhaust unit 550, and a lifting member 560. The body 510 may provide an inner space 518 in which the substrate W is treated. In the inner space 518, the substrate W may be dried by the treatment fluid in the supercritical state. The body 510 may also be referred to as a chamber or a vessel.

The body 510 may include an upper body 512 and a lower body 514. The upper body 512 and the lower body 514 may be coupled to each other to form the inner space 518. The substrate W may be supported by a support member or the like in the inner space 518. The support member may be configured to support the lower surface of an edge region of the substrate W.

Any one of the upper body 512 and the lower body 514 may be coupled to the lifting member 560 to move in the vertical direction. For example, the lower body 514 may be coupled to the lifting member 560 to be moved in the vertical direction by the lifting member 560. Accordingly, the inner space 518 of the body 510 may be selectively sealed. Although FIG. 3 illustrates that the lower body 514 is coupled to the lifting member 560 to move in the vertical direction, the disclosure is not limited thereto. For example, the upper body 512 may be coupled with the lifting member 560 to move in the vertical direction.

The temperature control member 520 may heat the treatment fluid supplied to the inner space 518. For example, the temperature control member 520 may be a heater. However, the disclosure is not limited thereto, and the temperature control member 520 may be variously modified into a known device capable of raising the temperature of the inner space 518. The temperature control member 520 may raise the temperature of the inner space 518 of the body 510 such that the supercritical state of the treatment fluid supplied to the inner space 518 is maintained.

The temperature control member 520 may be buried in the body 510. For example, the temperature control member 520 may be buried in any one of the upper body 512 and the lower body 514. However, the disclosure is not limited thereto, and the temperature control member 520 may be provided in various positions for raising the temperature of the inner space 518.

The fluid supply unit 530 may supply the treatment fluid to the inner space 518 of the body 510. The treatment fluid supplied by the fluid supply unit 530 may include carbon dioxide ($CO_2$). The fluid supply unit 530 may include a fluid supply source 531, a flow rate measuring member 532, a supply line 533, a supply valve 535, a flow rate control valve 537, a first pressure sensor 538, and a line heater 539.

The fluid supply source 531 may store and/or supply a treatment fluid supplied to the inner space 518 of the body 510. The treatment fluid stored and/or supplied by the fluid supply source 531 may be supplied to the inner space 518 through the supply line 533.

The flow rate measuring member 532 may be installed in the supply line 533. For example, the flow rate measuring member 532 may be installed in a main supply line 533a. The flow rate measuring member 532 may be a mass flow meter. The flow rate measuring member 532 may measure a supply flow rate per unit time of the treatment fluid flowing through the supply line 533. Here, the flow rate measuring member 532 may be a Coriolis flow meter. The Coriolis flow meter measures the flow rate of a mass by forcibly vibrating a pipe and detecting the displacement of the pipe due to the Coriolis force generated by the flow of a fluid.

According to an embodiment, the flow rate measuring member 532 may be installed between the fluid supply source 531 and the flow rate control valve 537. In addition, the treatment fluid inside the flow rate measuring member 532 may always be maintained as a supercritical single phase. By maintaining the treatment fluid inside the flow rate measuring member 532 to be the supercritical single phase, the supply flow rate per unit time of the treatment fluid measured by the flow rate measuring member 532 may be accurately measured. That is, according to an embodiment, because the treatment fluid is maintained as a supercritical state without a phase change, there is an effect of correcting a flow rate error of the flow rate measuring member 532.

The state of treatment fluid in the fluid supply source 531, the flow rate measuring member 532, the flow rate control valve 537, and an area of the supply line 533 from the fluid supply source 531 to the flow rate control valve 537 (hereinafter, referred to as area A) may be maintained as the supercritical single phase. The controller 30 may control at least one of the temperature and pressure of the treatment fluid such that the treatment fluid in area A is maintained as the supercritical state. The controller 30 may control the flow rate control valve 537 such that a supercritical fluid is supplied to the body 510 based on the flow rate of the supercritical fluid measured by the flow rate measuring member 532.

The flow rate measured by the flow rate measuring member 532 may be delivered to the controller 30 in real time. The controller 30 may control the internal pressure of the flow rate measuring member 532 to be at least 73 bar. The controller 30 may control the internal temperature of the flow rate measuring member 532 to be at least 31° C.

The supply line 533 may bring the fluid supply source 531 and the inner space 518 into fluid communication with each other. The supply line 533 may include the main supply line 533a, a first supply line 533b, and a second supply line 533c. One end of the main supply line 533a may be connected to the fluid supply source 531. The other end of the main supply line 533a may branch into the first supply line 533b and the second supply line 533c.

The first supply line 533b may be an upper supply line for supplying a drying gas, above the inner space 518 of the body 510. For example, the first supply line 533b may supply the drying gas to the inner space 518 of the body 510 in a downward direction. Here, the first supply line 533b may be connected to the upper body 512.

The second supply line 533c may be a lower supply line for supplying a drying gas, below the inner space 518 of the body 510. For example, the second supply line 533c may supply the drying gas to the inner space 518 of the body 510 in an upward direction. Here, the second supply line 533c may be connected to the lower body 514.

The supply valve 535 may include a main supply valve 535a, a first supply valve 535b, and a second supply valve 535c. The main supply valve 535a, the first supply valve 535b, and the second supply valve 535c may be on/off valves (auto valves). The main supply valve 535a may be installed in the main supply line 533a. The first supply valve 535b may be installed in the first supply line 533b. The second supply valve 535c may be installed in the second supply line 533c. The main supply valve 535a, the first supply valve 535b, and the second supply valve 535c may be turned on/off by receiving a control signal from the controller 30.

The flow rate control valve 537 may be installed in the main supply line 533a. The flow rate control valve 537 may be a valve capable of adjusting an opening/closing rate. The flow rate control valve 537 may be a metering valve. The flow rate control valve 537 may be installed downstream from the main supply valve 535a. The opening/closing rate of the flow rate control valve 537 may be controlled by receiving a control signal from the controller 30, or a user may manually set the opening/closing rate.

The first pressure sensor 538 may be installed in the supply line 533. The first pressure sensor 538 may be installed on the first supply line 533b among the supply lines 533. The first pressure sensor 538 may measure the pressure of the treatment fluid flowing through the first supply line 533b. Also, the first pressure sensor 538 may be installed downstream from the first supply valve 535b. An area of the first supply line 533b that is downstream of the first supply valve 535b may be a space in fluid communication with the inner space 518. The pressure measured by the first pressure sensor 538 may be identical to or similar to the pressure of the inner space 518. A change in the pressure measured by the first pressure sensor 538 may be similar in form to a change in the pressure of the inner space 518.

The heater 539 may include a main heater 539a, a first heater 539b, and a second heater 539c. The main heater 539a, the first heater 539b, and the second heater 539c may be block heaters. The main heater 539a may be installed in the main supply line 533a. The first heater 539b may be installed in the first supply line 533b. The second heater 539c may be installed in the second supply line 533c.

The fluid exhaust unit 550 may exhaust the treatment fluid from the inner space 518 of the body 510. The fluid exhaust unit 550 may include an exhaust line 551 and a pressure reducing valve 552 installed in the exhaust line 551. The exhaust line 551 may be in fluid communication with the inner space 518 of the body 510. The exhaust line 551 may exhaust the treatment fluid from the inner space 518 of the body 510 to the outside of the body 510.

One end of the exhaust line 551 may be connected to any one of the upper body 512 and the lower body 514. For example, one end of the exhaust line 551 may be connected to the lower body 514. The other end of the exhaust line 551 may branch into one or more lines.

A second pressure sensor 559 may be installed in the exhaust line 551. The second pressure sensor 559 may measure the pressure of the treatment fluid flowing through the exhaust line 551. The pressure measured by the second pressure sensor 559 may be identical to or similar to the pressure of the inner space 518. A change in the pressure measured by the second pressure sensor 559 may be similar in form to a change in the pressure of the inner space 518.

Figure 4:
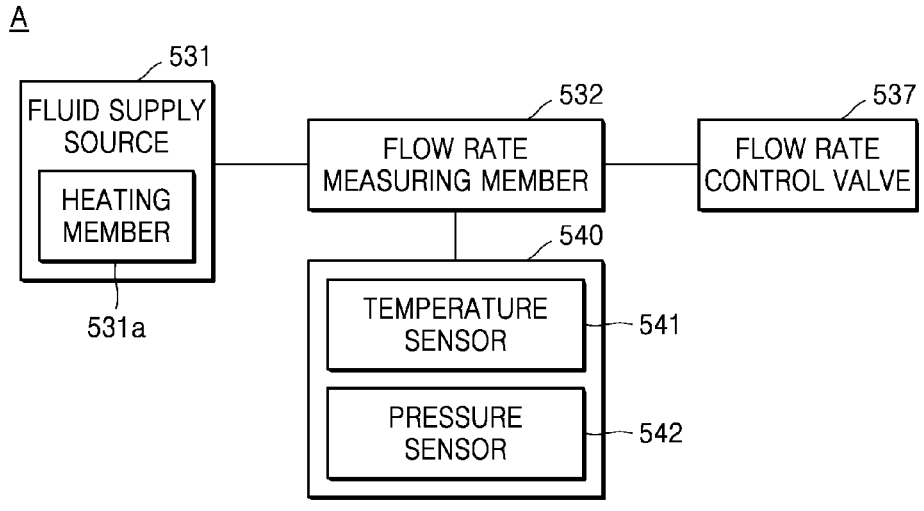
FIG. 4 is a block diagram schematically illustrating area A of FIG. 3.

FIG. 4 is a block diagram schematically illustrating area A of FIG. 3.

Referring to FIG. 4, the fluid supply unit 530 according to an embodiment may further include a sensor unit 540. The sensor unit 540 may include a temperature sensor 541 and a pressure sensor 542. The temperature sensor 541 may be configured to measure the temperature of a treatment fluid inside the flow rate measuring member 532. The pressure sensor 542 may be configured to measure the pressure of the treatment fluid inside the flow rate measuring member 532.

The temperature sensor 541 and the pressure sensor 542 may be arranged inside the fluid supply source 531. In addition, the temperature sensor 541 and the pressure sensor 542 may be installed in the supply line 533 and arranged between the fluid supply source 531 and the flow rate control valve 537. However, the disclosure is not limited thereto, and the temperature sensor 541 and the pressure sensor 542 may be installed at appropriate positions to measure the temperature and pressure of the treatment fluid inside the flow rate measuring member 532, respectively.

The temperature sensor 541 and the pressure sensor 542 may measure the temperature and pressure inside the flow rate measuring member 532, respectively. The controller 30 may control the temperature and pressure of the treatment fluid inside the flow rate measuring member 532 by providing feedback, based on pressure information and temperature information measured by the temperature sensor 541 and the pressure sensor 542, respectively.

According to an embodiment, the state of the treatment fluid inside area A may be maintained as a supercritical single phase. In order to maintain the state of the treatment fluid inside area A as a supercritical state, the controller 30 may control at least one of the temperature and pressure of the treatment fluid based on the pressure information and the temperature information measured by the temperature sensor 541 and the pressure sensor 542, respectively.

In addition, the fluid supply source 531 may further include a heating member 531a. The heating member 531a may be installed inside the fluid supply source 531. The heating member 531a may heat the treatment fluid such that the treatment fluid inside area A is maintained as a supercritical state. Here, the fluid supply source 531 may be configured to be able to seal the treatment fluid. The heating member 531a may heat the treatment fluid sealed inside the fluid supply source 531 such that the treatment fluid inside area A is maintained as the supercritical state.

Figure 5:
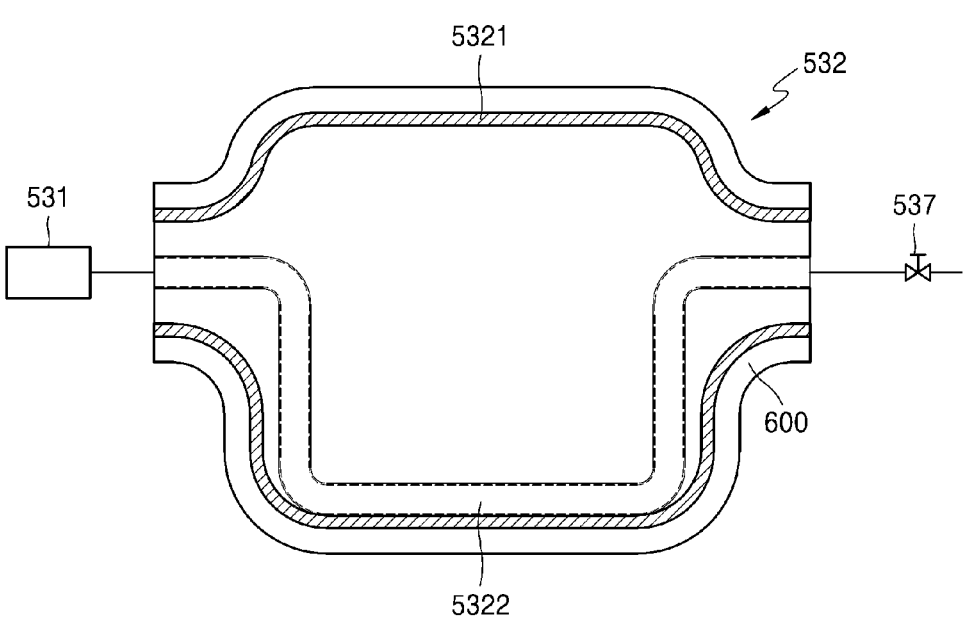
FIG. 5 is a cross-sectional view of a flow rate measuring member according to an embodiment.

FIG. 5 is a cross-sectional view of a flow rate measuring member according to an embodiment.

Referring to FIG. 5, the flow rate measuring member 532 of the disclosure may include a housing 5321 and one or more fluid pipes 5322. The fluid pipes 5322 may be installed inside the housing 5321. The fluid pipes 5322 may have a cylindrical shape and may be curved. The one or more fluid pipes 5322 may be arranged in parallel in the vertical direction and/or the horizontal direction.

A supercritical fluid may flow inside the fluid pipes 5322. The fluid supply unit 530 of the disclosure may control the temperature and/or pressure of the treatment fluid such that the supercritical fluid flowing inside the fluid pipes 5322 are always maintained as the supercritical state.

The fluid supply unit 530 may further include an insulator 600 surrounding the surface of the supply line 533 and/or the flow rate measuring member 532 (see FIG. 3). For example, the insulator 600 may cover the surface of the housing 5321 of the flow rate measuring member 532. The heat insulating material may maintain the state of the treatment fluid inside area A as the supercritical state. The insulator 600 may maintain the temperature around area A to be at least 31° C. such that the treatment fluid inside area A is maintained as the supercritical state.

Hereinafter, a substrate processing method according to an embodiment will be described. The substrate processing method described below may be performed by a substrate processing apparatus. As described above, the controller 30 may control the substrate processing apparatus to perform the substrate processing method to be described below.

Figure 6:
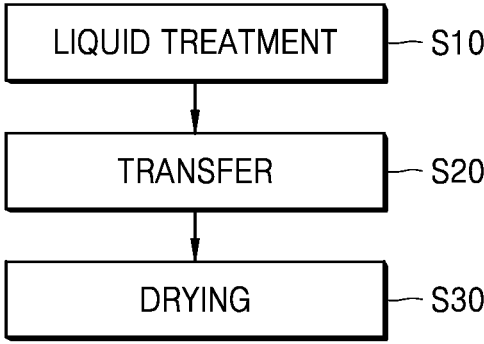
FIG. 6 is a flowchart of a substrate processing method according to an embodiment.

FIG. 6 is a flowchart of a substrate processing method according to an embodiment.

Referring to FIG. 6, the substrate processing method according to an embodiment may include a liquid treatment operation S10, a transfer operation S20, and a drying operation S30.

The liquid treatment operation S10 is an operation of liquid-treating the substrate W by supplying a treatment liquid to the substrate W. The liquid treatment operation S10 may be performed in the liquid treatment chamber 400. For example, in the liquid treatment operation S10, the substrate W may be liquid-treated by supplying the treatment liquid to the rotating substrate W.

The treatment liquid supplied in the liquid treatment operation S10 may include at least one of the above-described chemical, rinsing liquid, and organic solvent, and a developing liquid. For example, in the liquid treatment operation S10, the substrate W may be rinsed by supplying a rinsing liquid to the rotating substrate W. Thereafter, the rinsing liquid remaining on the substrate W may be replaced with an organic solvent by supplying the organic solvent to the rotating substrate W. In addition, in the liquid treatment operation S10, a developing liquid may be supplied to the rotating substrate W to develop the substrate W.

The transfer operation S20 is an operation of transferring the substrate W. The transfer operation S20 may be an operation of transferring the liquid-treated substrate W to the drying chamber 500. For example, in the transfer operation S20, the transfer robot 320 may transfer the substrate W from the liquid treatment chamber 400 to the inner space 518 of the drying chamber 500. The treatment liquid may remain on the substrate W, which is to be transferred in the transfer operation S20. For example, the organic solvent may remain on the substrate W. For example, the developing liquid may remain on the substrate W. That is, the substrate W may be transferred to the drying chamber 500 in a state in which the upper surface of the substrate W is wetted with the developing liquid or the organic solvent.

The drying operation S30 is an operation of drying the substrate W by using a treatment fluid in a supercritical state after the substrate W is loaded into the inner space 518. The drying operation S30 may be performed in the drying chamber 500. The substrate W may be dried by supplying a treatment fluid to the substrate W in the inner space 518 of the body 510. The treatment fluid in the supercritical state may be delivered to the substrate W in the inner space 518. The treatment fluid in the supercritical state delivered to the substrate W may be mixed with the treatment liquid remaining on the upper surface of the substrate W. As the treatment fluid mixed with the treatment liquid is discharged from the inner space 518, the treatment liquid may be removed from the substrate W.

Figure 7:
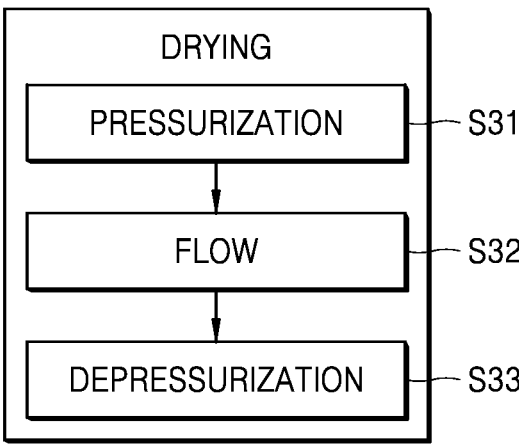
FIG. 7 is a detailed flowchart of a drying operation of FIG. 6.

FIG. 7 is a detailed flowchart of the drying operation of FIG. 6.

Referring to FIG. 7, the drying operation S30 according to an embodiment may include a pressurization operation S31, a flow operation S32, and a depressurization operation S33. The pressurization operation S31, the flow operation S32, and the depressurization operation S33 may be performed sequentially.

The pressurization operation S31 may be an operation of increasing the pressure of the inner space 518 to a preset pressure. The pressurization operation S31 may be performed after the substrate W is loaded into the inner space 518. In the pressurization operation S31, a treatment fluid may be supplied to the inner space 518 to increase the pressure of the inner space 518 to the preset pressure.

The flow operation S32 may be performed after the pressurization operation S31. In the flow operation S32, a treatment fluid may be supplied to the inner space 518, or the treatment fluid may be discharged from the inner space 518. In the flow operation S32, the pressure of the inner space 518 may vary due to a partial pressure difference. In the flow operation S32, a flow is formed in the treatment fluid supplied to the inner space 518, and thus, the treatment liquid remaining on the substrate W may be more effectively removed from the substrate W. The flow operation S32 may also be referred to as a treatment operation.

The pressurization operation S31 and the flow operation S32 may include measuring the flow rate of the treatment fluid by using the flow rate measuring member 532. The flow rate measuring member 532 may be installed in the supply line 533 and positioned between the fluid supply source 531 and the flow rate control valve 537.

In the measuring of the flow rate of the treatment fluid using the flow rate measuring member 532, the treatment fluid inside the flow rate measuring member 532 may be maintained as a supercritical single phase. By maintaining the treatment fluid inside the flow rate measuring member 532 to be the supercritical single phase, the supply flow rate per unit time of the treatment fluid measured by the flow rate measuring member 532 may be accurately measured. Therefore, there is an effect of correcting the flow rate error of the flow rate measuring member 532.

While the flow operation S32 is performed, the controller 30 may adjust the opening/closing rate of the flow rate control valve 537 based on the flow rate measured by the flow rate measuring member 532, such that the flow rate of the treatment fluid flowing in the inner space 518 is constantly maintained as a preset flow rate. In addition, the opening/closing rate of the flow rate control valve 537 may be manually adjusted by a user.

The depressurization operation S33 may be performed after the flow operation S32. The depressurization operation S33 may be an operation of decreasing the pressure of the inner space 518 of the body 510 to a preset pressure.

Embodiments have been described herein and illustrated in the drawings. Although the embodiments have been described herein by using specific terms, they are used only for the purpose of explaining the technical spirit of the disclosure and not used to limit the meaning or scope of the claims. Therefore, those of skill in the art will understand that various modifications and other equivalent embodiments may be derived from the embodiments described herein. Therefore, the true technical protection scope of the disclosure should be determined by the appended claims.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing apparatus comprising:
a chamber comprising an inner space;
a fluid supply unit configured to supply a supercritical fluid to the inner space;
a fluid exhaust unit configured to exhaust the supercritical fluid from the inner space; and
a controller configured to control the fluid supply unit and the fluid exhaust unit,
wherein the fluid supply unit comprises:
a fluid supply source;
a supply line connecting the fluid supply source and the chamber to each other;
a flow rate control valve installed in the supply line; and
a flow rate measuring member installed in the supply line and positioned between the fluid supply source and the flow rate control valve,
wherein the controller is further configured to control the flow rate control valve to supply the supercritical fluid, based on a flow rate of the supercritical fluid measured by the flow rate measuring member, and
wherein the controller is further configured to control a pressure or a temperature of the supercritical fluid, thereby maintaining a state of the supercritical fluid inside the flow rate measuring member as a supercritical single phase.

2. The substrate processing apparatus of claim 1, wherein the fluid supply unit further comprises:
a pressure sensor configured to measure a pressure of the supercritical fluid inside the flow rate measuring member; and
a temperature sensor configured to measure a temperature of the supercritical fluid inside the flow rate measuring member,
wherein the pressure sensor and the temperature sensor are configured to provide feedback to the controller to maintain the supercritical fluid inside the flow rate measuring member as the supercritical single phase.

3. The substrate processing apparatus of claim 2,
wherein the pressure sensor and the temperature sensor are provided with the flow rate measuring member.

4. The substrate processing apparatus of claim 2, wherein the pressure sensor and the temperature sensor are installed in the supply line and positioned between the fluid supply source and the flow rate control valve.

5. The substrate processing apparatus of claim 2,
wherein the controller is further configured to maintain a state of the supercritical fluid inside the flow rate measuring member by providing feedback, based on pressure information and temperature information measured by the temperature sensor and the pressure sensor, respectively.

6. The substrate processing apparatus of claim 2, wherein the controller is further configured to control an internal pressure of the flow rate measuring member, by receiving pressure information from the pressure sensor and temperature information from the temperature sensor associated with the flow rate measuring member, and controlling at least one of the flow rate control valve and a heating member based on the received pressure information and the received temperature information, to be at least 73 bar, and control an internal temperature of the flow rate measuring member to be at least 31° C.

7. The substrate processing apparatus of claim 1, wherein the fluid supply source comprises a heating member configured to heat the supercritical fluid.

8. The substrate processing apparatus of claim 1, wherein the fluid supply unit further comprises an insulator surrounding surfaces of the supply line and the flow rate measuring member.

9. The substrate processing apparatus of claim 1, wherein the fluid exhaust unit comprises:

an exhaust line connected to the chamber; and a pressure reducing valve installed in the exhaust line and configured to maintain a pressure of the inner space.

10. The substrate processing apparatus of claim 1, wherein the fluid supply source is configured to store and/or supply the supercritical fluid.

11. The substrate processing apparatus of claim 1, wherein the controller is further configured to control at least one of a temperature and a pressure of the supercritical fluid by receiving temperature information or pressure information associated with the supercritical fluid and controlling at least one of a heating member and a flow rate control valve based on the received information such that a state of the supercritical fluid in the fluid supply source, the flow rate control valve, and an area of the supply line from the fluid supply source to the flow rate control valve is maintained as a supercritical single phase.

12. A method of treating a substrate with a supercritical fluid in a supercritical state by using a substrate processing apparatus comprising a chamber, a fluid supply source, and a flow rate control valve, the method comprising:

loading the substrate into an inner space of the chamber;

a pressurization operation of increasing a pressure of the inner space by supplying the supercritical fluid to the inner space through a supply line communicating with the inner space;

a flow operation of flowing the supercritical fluid by supplying the supercritical fluid to the inner space or discharging the supercritical fluid from the inner space; and a depressurization operation of decreasing pressure of the inner space by discharging the supercritical fluid from the inner space through a depressurization line communicating with the inner space, wherein the pressurization operation and the flow operation comprise measuring a flow rate of the supercritical fluid by using a flow rate measuring member installed in the supply line and positioned between the fluid supply source and the flow rate control valve while a state of the supercritical fluid inside the flow rate measuring member is maintained as a supercritical single phase, and

wherein the flow rate control valve is controlled to supply the supercritical fluid, based on the flow rate of the supercritical fluid measured in the measuring of the flow rate of the supercritical fluid.

13. The method of claim 12, wherein the pressurization operation and the flow operation further comprise controlling a state of the supercritical fluid in the fluid supply source, the flow rate control valve, and an area of the supply line from the fluid supply source to the flow rate control valve, to be maintained as the supercritical single phase, by heating the supercritical fluid in the fluid supply source to maintain the supercritical fluid as the supercritical single phase at the flow rate measuring member during the pressurization and flow operations.

14. The method of claim 12, wherein the pressurization operation and the flow operation further comprise controlling an internal pressure of the flow rate measuring member to be at least 73 bar, and controlling an internal temperature of the flow rate measuring member to be at least 31° C.

15. The method of claim 12, wherein the pressurization operation and the flow operation further comprise controlling a state of the supercritical fluid inside the flow rate measuring member by providing feedback, based on pressure information and temperature information measured by a temperature sensor and a pressure sensor, respectively.

16. A substrate processing apparatus for drying a substrate by using a supercritical fluid, the substrate processing apparatus comprising:

a chamber comprising an inner space;

a fluid supply unit configured to supply the supercritical fluid to the inner space;

a fluid exhaust unit configured to exhaust the supercritical fluid from the inner space; and a controller configured to control the fluid supply unit and the fluid exhaust unit, wherein the fluid supply unit comprises:

a fluid supply source storing the supercritical fluid;

a supply line connecting the fluid supply source and the chamber to each other;

a flow rate control valve installed in the supply line; and a flow rate measuring member installed in the supply line and positioned between the fluid supply source and the flow rate control valve, and wherein the controller is further configured to control at least one of a temperature and a pressure of the supercritical fluid by receiving temperature information or pressure information associated with the supercritical fluid and controlling at least one of a heating member and the flow rate control valve based on the received temperature information or the received pressure information, and to control the flow rate control valve to supply the supercritical fluid, based on a flow rate of the supercritical fluid measured by the flow rate measuring member such that a state of the supercritical fluid is maintained as a supercritical single phase.

17. The substrate processing apparatus of claim 16, wherein the controller is further configured to control an internal pressure of the flow rate measuring member, by receiving the pressure information from a pressure sensor and the temperature information from a temperature sensor associated with the flow rate measuring member, and controlling at least one of the flow rate control valve and the heating member based on the received pressure information and the received temperature information, to be at least 73 bar, and control an internal temperature of the flow rate measuring member to be at least 31° C.

18. The substrate processing apparatus of claim 17, wherein the fluid supply unit further comprises:

a pressure sensor configured to measure a pressure of the flow rate measuring member; and a temperature sensor configured to measure a temperature of the flow rate measuring member, wherein the pressure sensor and the temperature sensor are configured to provide feedback to the controller to maintain the supercritical fluid inside the flow rate measuring member as the supercritical single phase.

19. The substrate processing apparatus of claim 18, wherein the controller is further configured to maintain a state of the supercritical fluid inside the flow rate measuring member by providing feedback, based on the pressure information and the temperature information measured by the temperature sensor and the pressure sensor, respectively.

\* \* \* \* \*